United States Patent [19]

Beretta

[11] 4,209,798
[45] Jun. 24, 1980

[54] MODULE FOR INTEGRATED CIRCUITS

[75] Inventor: Giacomo Beretta, Milan, Italy

[73] Assignee: Sgs-Ates Componenti Elettronici S.p.A., Milan, Italy

[21] Appl. No.: 22,476

[22] Filed: Mar. 21, 1979

Related U.S. Application Data

[63] Continuation of Ser. No. 843,943, Oct. 20, 1977, abandoned.

[30] Foreign Application Priority Data

Oct. 21, 1976 [IT] Italy .................................. 22348 B/76

[51] Int. Cl.$^2$ ...................... H01L 23/48; H01L 29/44; H01L 23/28
[52] U.S. Cl. ......................................... 357/70; 357/72; 357/81; 174/16 HS
[58] Field of Search ....................... 357/70, 80, 72, 81; 174/16 HS

[56] References Cited

U.S. PATENT DOCUMENTS

| | | | |
|---|---|---|---|
| 3,431,092 | 3/1969 | Lehner | 357/70 |
| 3,611,061 | 10/1971 | Segerson | 357/70 |
| 3,628,483 | 12/1971 | Pauza | 357/72 |
| 3,651,448 | 3/1972 | Pauza | 357/70 |
| 3,654,695 | 4/1972 | Delgaudio et al. | 357/81 |
| 3,670,215 | 6/1972 | Wilkens et al. | 357/81 |
| 3,723,833 | 3/1973 | Wheatley | 357/70 |
| 3,958,075 | 5/1976 | Kaufman | 357/70 |
| 4,004,195 | 1/1977 | Harayda et al. | 357/81 |
| 4,054,901 | 10/1977 | Edwards et al. | 357/81 |
| 4,093,971 | 6/1978 | Chu et al. | 357/81 |

FOREIGN PATENT DOCUMENTS

| | | | |
|---|---|---|---|
| 2425723 | 11/1975 | Fed. Rep. of Germany | 357/81 |
| 1316086 | 5/1973 | United Kingdom | 357/81 |
| 1334173 | 10/1973 | United Kingdom | 357/81 |

*Primary Examiner*—Andrew J. James
*Attorney, Agent, or Firm*—Karl F. Ross

[57] ABSTRACT

A metal foil carrying a semiconductive chip, encased in a resinous body of generally rectangular outline, has a solid portion extending within the body from the region of the chip toward or beyond a major side of that body and terminates in a set of exposed, bent-over tongues symmetrically duplicating a set of conductor strips which are tied to respective chip terminals and pass outwardly along the opposite major side of the body. The solid foil portion and/or the tongues integral therewith are in contact with a heat-dissipating member disposed outside the resinous body.

8 Claims, 8 Drawing Figures

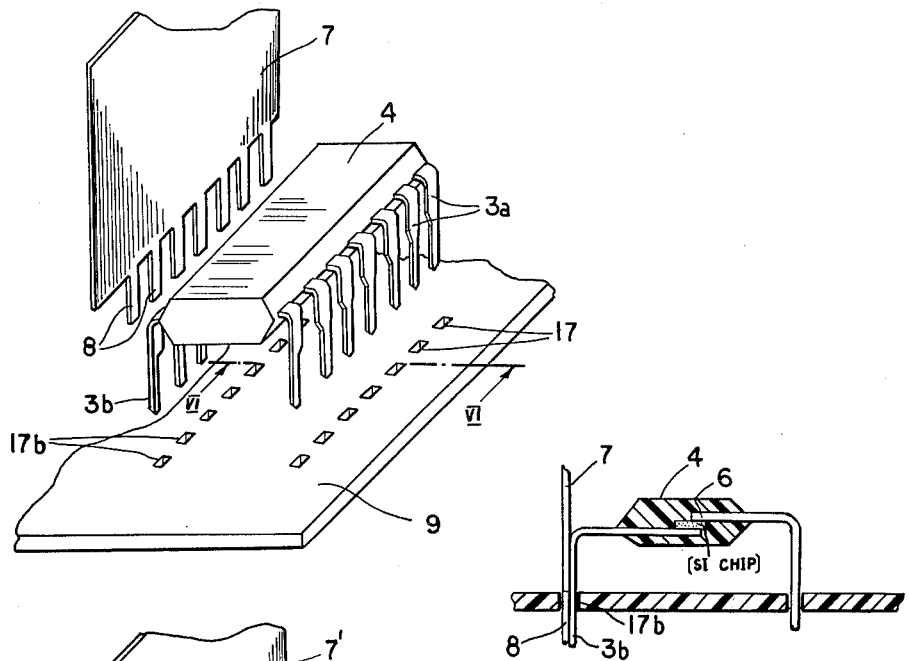
FIG. 5
FIG. 6
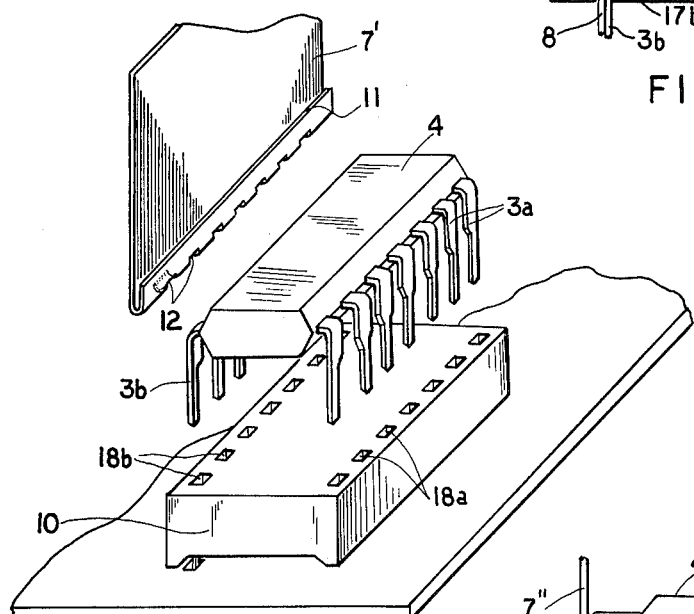
FIG. 7
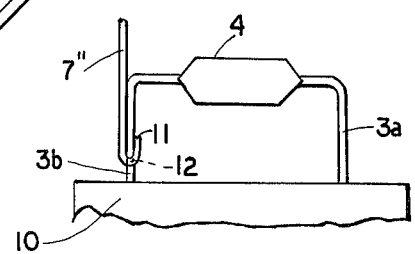
FIG. 8

MODULE FOR INTEGRATED CIRCUITS

This is a continuation of application Ser. No. 843,943, filed Oct. 20, 1977 and now abandoned.

FIELD OF THE INVENTION

My present invention relates to an integrated circuit incorporating a modular unit of the type wherein a semiconductive chip, having terminals connected to a plurality of conductor strips, is encased in a body of synthetic resin from which the free ends of the strips project for connection to further circuit elements.

BACKGROUND OF THE INVENTION

In commonly owned U.S. Pat. No. 3,689,683 there has been disclosed a modular unit of this type whose conductor strips are formed by stamping or etching from a coherent metal foil having wing portions mounted on bosses of a metal bar acting as a heat sink, these wing portions being separated from the conductor strips in the finished module in which the resinous body also envelops the bar at its top and sides. The conductor strips form two symmetrical arrays with free ends projecting from opposite edges of the resinous body; these free ends may be bent over at right angles to the foil surface, although they could also extend in other directions (e.g. as shown in commonly owned U.S. Pat. No. 4,032,706).

The use of an embedded heat sink is not always the best solution. Thus, with power amplifiers or the like it may be desirable to establish a thermal connection between the embedded chip and an external metallic member which, being exposed to the atmosphere, dissipates the developing heat more quickly.

On the other hand, when microelectric modules of various types are to be produced in large quantities, it is convenient to use components of similar configuration regardless of whether the generated heat is to be dissipated by encased or external members.

OBJECTS OF THE INVENTION

An important object of my present invention, therefore, is to provide an integrated-circuit component of the character described whose temperature can be effectively controlled by a thermally conductive metallic member positioned outside its resinous body.

A more particular object is to provide a component of this character which is basically similar to conventional modules such as those described in the aforementioned U.S. Pat. No. 3,689,683.

SUMMARY OF THE INVENTION

These objects are realized, in accordance with my present invention, by providing a metal foil having a solid portion of generally rectangular configuration with a limited seat-forming area, carrying the semiconductive chip, along one major edge of the rectangle and a plurality of transverse tongues integrally projecting from the opposite major edge thereof, these tongues preferably constituting an array which substantially duplicates an array of conductor strips connected to respective chip terminals and disposed opposite the tongues substantially parallel to same. A body of synthetic resin encases the chip, part of the conductor strips and part of the metal foil while leaving free ends of its tongues as well as of the conductor strips projecting from opposite edges of that body; a heat-dissipating metallic member is closely juxtaposed outside the body with an exposed part of the metal foil, i.e. with its tongues and/or with part of the solid portion thereof.

BRIEF DESCRIPTION OF THE DRAWING

The above and other features of my invention will now be described in detail with reference to the accompanying drawing in which:

FIG. 5 is a perspective exploded view of another embodiment;

FIG. 6 is a cross-sectional view taken along the line VI—VI of FIG. 5 but showing the module in its assembled state;

FIG. 7 is a view similar to FIG. 5, illustrating a further embodiment; and

FIG. 8 is an end view of the unit of FIG. 7, again in the assembled state.

SPECIFIC DESCRIPTION

Figure 1:
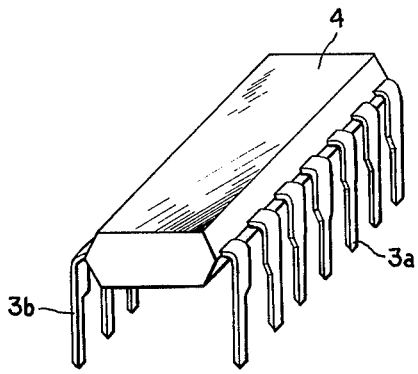
FIG. 1 is a perspective view of a microelectric module representative of both the prior art and the present invention.
Figure 2:
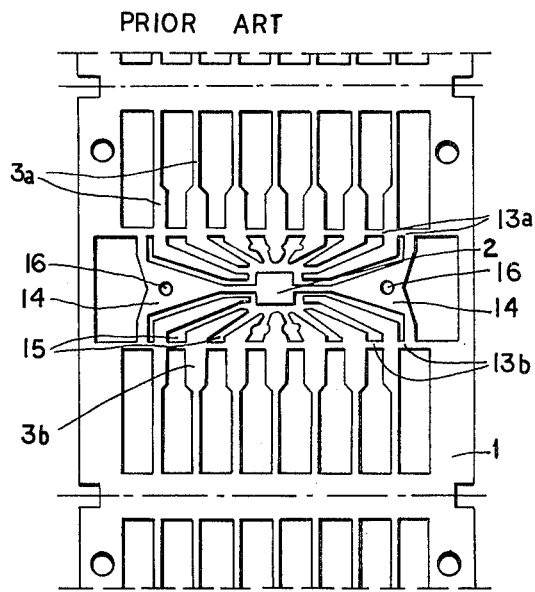
FIG. 2 is a face view of a prior-art metal foil to be used with a module of the type shown in FIG. 1.

In FIG. 1 I have shown a microelectronic module of the dual-in-line type, similar to that disclosed in U.S. Pat. No. 3,689,683 (but without its embedded heat sink), comprising a resinous body 4 of rectangular outline from whose major sides two sets of tongues 3a and 3b project in a pair of symmetrical arrays. The free ends of the tongues are bent over at points close to the edges of body 4 so as to be perpendicular to a metal foil from which these tongues are obtained as described in that prior patent. Such a foil 1, shown in FIG. 2, is originally part of a coherent sheet of conductive metal, its tongues 3a and 3b being interconnected by bridges 13a and 13b which are subsequently severed. The foil 1 of FIG. 2 is essentially conventional, differing from that of U.S. Pat. No. 3,689,683 only by the presence of a central square 2 integral with a pair of lateral wings 14 which according to the patent come to rest on the embedded metal bar. A semiconductor chip, with circuit terminals to be connected to the embedded extremities of tongues 3a and 3b, comes to rest on square 2 instead of being seated directly on the underlying metal bar as in the prior patent.

Figure 3:
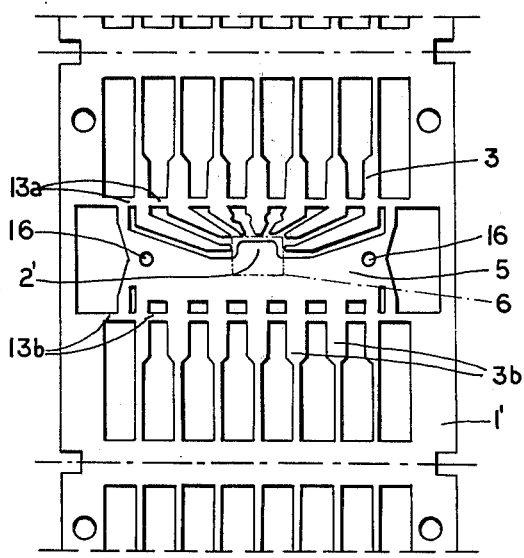
FIG. 3 is a view similar to FIG. 2 but showing a modified metal foil according to my invention.

In FIG. 3 I have shown a modified metal foil 1' having a solid portion 5 of generally rectangular configuration, with a limited seat-forming area 2' projecting from one of the major edges (here the upper one) of the rectangle. The tongues 3b, which in this case are not used as electrical leads, project transversely from the opposite (lower) major edge of foil portions 5 by which they remain integrally interconnected even after severance of the bridges 13b. The set of tongues 13b acts as a thermal conductor through which heat generated at a chip 6, mounted on seating area 2', can be carried off to an external metallic member as more fully described hereinafter. Tongues 3a are soldered to respective terminals of chip 6 to act as conductor strips upon being insulated from one another by the severance of bridges 13a.

It will be noted that the overall configuration of foil 1' with its tongues 3a, 3b is very similar to that of foil 1 in FIG. 2, the only difference being the absence of slots 15 by which the tongues 3b are separated in the conventional arrangement. In fact, foil portion 5 is shown to have holes 16 which correspond to those of wings 14 in FIG. 2 and could be used for the purpose of fitting the foil onto an underlying heat sink as in the prior patent.

Figure 4:
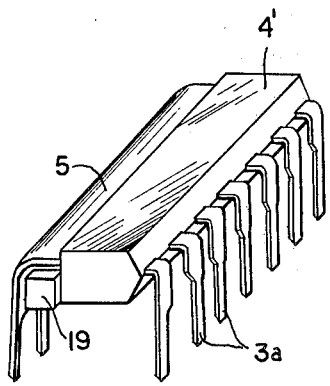
FIG. 4 is a view similar to FIG. 1, illustrating an external heat-dissipating member juxtaposed with a solid portion of the foil of FIG. 3.

With the module shown in FIG. 1, foil portion 5 is entirely encased by resinous body 4 so as to be invisible. As shown in FIG. 4, however, I may use a narrower body 4' leaving exposed a substantial part of foil portion 5 which can then be juxtaposed with and possibly soldered onto an external metal bar 19 acting as a heat sink. If desired, bar 19 could also be enlarged and extended partly into the resinous body 4', terminating in the vicinity of chip 6 (FIG. 3). The chip usually consists of silicon.

In FIGS. 5 and 6 I have shown an alternate heat sink in the form of a metallic sheet 7 with a set of parallel prongs or tabs 8 whose width and spacing substantially correspond to those of tongues 3b and which can thus be juxtaposed with these tongues for joint introduction into a set of apertures 17b in a substrate supporting the module, specifically in a printed-circuit board 9 also having apertures 17a to be penetrated by the free ends of leads 3a. Tabs 8 and tongues 3b could also be fixedly interconnected, e.g. by soldering or crimping.

In FIGS. 7 and 8 I have illustrated a modified metal sheet 7' with a bent-over edge 11 forming a J-shaped profile, the bight of the J being provided with a series of apertures 12 through which the tongues 3b pass while being enfolded by the edge 11. It will be noted that these tongues 3b, like their counterparts 3a, are narrower at their free ends than in the immediate vicinity of body 4, their enfolded parts being wider than the apertures 12. In this instance a base block 10 of nonconductive material has apertures 18a and 18b to be penetrated by the free ends of tongues 3a and 3b, tongues 3a being connected to other circuit elements inside the block 10. Here, too, sheet 7' could be positively connected with prongs 3b.

I claim:

1. In an integrated circuit, in combination:
   a metal foil having a solid portion of generally rectangular configuration with a limited seat-forming area along one major edge of the rectangle and a plurality of transverse tongues integrally projecting from the opposite major edge thereof;
   a semiconductive chip bearing integrated circuitry and resting on said seat-forming area;
   an array of mutually disconnected conductor strips connected to respective terminals of said chip and disposed opposite said tongues substantially parallel to the latter;
   an elongate body of synthetic resin encasing said chip, part of said conductor strips and part of said metal foil while leaving free ends of said tongues and of said conductor strips projecting from opposite longitudinal edges of said body; and
   a heat-dissipating metallic member extending over substantially the entire length of said body while being closely juxtaposed and in contact substantially throughout said length with an exposed part of said metal foil, including said tongues, adjacent one of said opposite longitudinal edges.

2. The combination defined in claim 1 wherein said solid portion projects from said body at said one of said opposite longitudinal edges substantially throughout said length and is in contact with said member.

3. The combination defined in claim 1 wherein said member is a sheet in contact with the free ends of said tongues.

4. The combination defined in claim 3 wherein the free ends of said tongues and of said conductor strips are bent over at said opposite edges in a direction substantially perpendicular to said solid portion, further comprising a substrate which perforations penetrated by said free ends.

5. The combination defined in claim 4 wherein said sheet has tabs extending together with the free ends of respective tongues into the tongue-receiving perforations of said substrate.

6. The combination defined in claim 3 wherein said sheet has a bent-over edge forming a bight enfolding a part of each tongue, the free ends of said tongues passing through respective apertures in said bight.

7. The combination defined in claim 6 wherein the enfolded part of each tongue is wider than the free end thereof.

8. The combination defined in claim 1 wherein the free ends of said tongues and of said conductor strips form two substantially symmetrical arrays.

* * * * *